US011495688B2

(12) United States Patent
Cheng et al.

(10) Patent No.: US 11,495,688 B2
(45) Date of Patent: Nov. 8, 2022

(54) SOURCE AND DRAIN EPITAXY AND ISOLATION FOR GATE STRUCTURES

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Peng Xu, Santa Clara, CA (US); Zhenxing Bi, Dunn Loring, VA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 17/197,477

(22) Filed: Mar. 10, 2021

(65) Prior Publication Data
US 2021/0288184 A1    Sep. 16, 2021

Related U.S. Application Data

(62) Division of application No. 16/352,323, filed on Mar. 13, 2019, now Pat. No. 10,985,279.

(51) Int. Cl.
*H01L 21/768* (2006.01)
*H01L 29/66* (2006.01)
(Continued)

(52) U.S. Cl.
CPC .. *H01L 29/78609* (2013.01); *H01L 21/02532* (2013.01); *H01L 21/02603* (2013.01); *H01L 21/3065* (2013.01); *H01L 21/76805* (2013.01); *H01L 21/76895* (2013.01); *H01L 29/0653* (2013.01); *H01L 29/0673* (2013.01);
(Continued)

(58) Field of Classification Search
CPC ......... H01L 29/78609; H01L 21/02532; H01L 21/02603; H01L 21/3065; H01L 21/76805; H01L 21/76895; H01L 29/0653; H01L 29/0673; H01L 29/41733; H01L 29/42392; H01L 29/66545; H01L 29/66553;
(Continued)

(56) References Cited

U.S. PATENT DOCUMENTS 8,956,942 B2    2/2015  Loubet et al.
9,490,335 B1 *  11/2016 Doris .................. H01L 21/8238
(Continued)

OTHER PUBLICATIONS

List of IBM Patents or Patent Applications Treated as Related dated Mar. 10, 2021, 2 pages.

*Primary Examiner* — Earl N Taylor
(74) *Attorney, Agent, or Firm* — Tutunjian & Bitetto, P.C.; Randall Bluestone

(57) ABSTRACT

Semiconductor devices and methods for forming the semiconductor devices include forming a sacrificial layer on a substrate on each side of a stack of nanosheets, the stack of nanosheets including first nanosheets and second nanosheets stacked in alternating fashion with a dummy gate structure formed thereon. Source and drain regions are grown on from the sacrificial layer and from ends of the second nanosheets to form source and drain regions in contact with each side of the stack of nanosheets. The sacrificial layer is removed. An interlevel dielectric is deposited around the source and drain regions to fill between the source and drain regions and the substrate.

17 Claims, 11 Drawing Sheets

(51) Int. Cl.
  *H01L 29/06* (2006.01)
  *H01L 29/423* (2006.01)
  *H01L 29/786* (2006.01)
  *H01L 21/02* (2006.01)
  *H01L 21/3065* (2006.01)
  *H01L 29/417* (2006.01)

(52) U.S. Cl.
  CPC .. *H01L 29/41733* (2013.01); *H01L 29/42392* (2013.01); *H01L 29/66545* (2013.01); *H01L 29/66553* (2013.01); *H01L 29/66742* (2013.01); *H01L 29/78696* (2013.01)

(58) Field of Classification Search
  CPC ......... H01L 29/66742; H01L 29/78696; H01L 29/66439; H01L 29/775; B82Y 10/00
  See application file for complete search history.

(56) References Cited

U.S. PATENT DOCUMENTS

| | | | |
|---|---|---|---|
| 9,620,590 B1 | 4/2017 | Bergendahl et al. | |
| 9,741,792 B2 | 8/2017 | Cheng et al. | |
| 9,761,722 B1 | 9/2017 | Jagannathan et al. | |
| 9,847,390 B1 * | 12/2017 | Xie | H01L 29/78684 |
| 9,881,998 B1 * | 1/2018 | Cheng | H01L 21/02565 |
| 9,984,936 B1 * | 5/2018 | Xie | H01L 29/66439 |
| 10,032,867 B1 * | 7/2018 | Yeung | H01L 29/0649 |
| 10,243,061 B1 * | 3/2019 | Cheng | H01L 21/31116 |
| 10,269,983 B2 * | 4/2019 | Frougier | H01L 29/785 |
| 10,418,493 B2 * | 9/2019 | Leobandung | H01L 21/02532 |
| 10,439,049 B2 * | 10/2019 | Basker | H01L 29/775 |
| 10,483,166 B1 * | 11/2019 | Cheng | H01L 29/78654 |
| 10,832,907 B2 * | 11/2020 | Cheng | H01L 29/6653 |
| 10,840,360 B2 * | 11/2020 | Basker | H01L 29/7853 |
| 2015/0123215 A1 | 5/2015 | Obradovic et al. | |
| 2015/0295084 A1 | 10/2015 | Obradovic et al. | |
| 2016/0071729 A1 * | 3/2016 | Hatcher | H01L 29/42392 438/157 |
| 2017/0040321 A1 * | 2/2017 | Mitard | H01L 27/092 |
| 2017/0133459 A1 | 5/2017 | Pranatharthiharan et al. | |
| 2018/0019305 A1 * | 1/2018 | Cheng | H01L 27/092 |
| 2018/0047832 A1 * | 2/2018 | Tapily | H01L 29/785 |
| 2018/0342427 A1 * | 11/2018 | Xie | H01L 29/66439 |
| 2019/0035913 A1 * | 1/2019 | Cheng | B82Y 10/00 |
| 2019/0189769 A1 * | 6/2019 | Basker | H01L 29/167 |
| 2019/0341467 A1 * | 11/2019 | Basker | H01L 29/0843 |
| 2020/0027959 A1 * | 1/2020 | Cheng | H01L 29/6653 |
| 2020/0294866 A1 * | 9/2020 | Cheng | H01L 29/78696 |
| 2020/0295198 A1 * | 9/2020 | Cheng | H01L 29/775 |

* cited by examiner

SOURCE AND DRAIN EPITAXY AND ISOLATION FOR GATE STRUCTURES

BACKGROUND

The present invention generally relates to epitaxy and isolation for source and drain regions, and more particularly to source and drain epitaxy and isolation in gate structures of transistors and other semiconductor devices.

Reducing the size of transistors and other semiconductor devices can give rise to complications with growth of some components, such as, e.g., source and drain regions. The small features of various structures can slow or impair the growth of the source and drain regions off of one or more of those structures. Moreover, tighter pitches can reduce the distance between components, which can increase current leakage, compromising transistor performance.

SUMMARY

In accordance with an embodiment of the present invention, a method for forming a semiconductor is presented. The method includes forming a sacrificial layer on a substrate on each side of a stack of nanosheets, the stack of nanosheets including first nanosheets and second nanosheets stacked in alternating fashion with a dummy gate structure formed thereon. Source and drain regions are grown on from the sacrificial layer and from ends of the second nanosheets to form source and drain regions in contact with each side of the stack of nanosheets. The sacrificial layer is removed. An interlevel dielectric is deposited around the source and drain regions to fill between the source and drain regions and the substrate.

In accordance with another embodiment of the present invention, a method for forming a semiconductor is presented. The method includes forming a dummy gate structure on a stack of nanosheets over a substrate, the stack of nanosheets including first nanosheets and second nanosheets stacked in alternating fashion. Ends of the first nanosheets are recessed. Inner spacers are deposited on the recessed ends of the first nanosheets. A sidewall hardmask is deposited on each side of the stack of nanosheets and the dummy gate structure. A sacrificial layer is deposited on the substrate on each side of the stack of nanosheets. The sidewall hardmask is recessed down to the sacrificial layer. Source and drain regions are grown on from the sacrificial layer and from ends of the second nanosheets to form source and drain regions in contact with each side of the stack of nanosheets. The sacrificial layer is removed and an interlevel dielectric is deposited around the source and drain regions to fill between the source and drain regions and the substrate.

In accordance with another embodiment of the present invention, a semiconductor device is presented. The semiconductor device includes a substrate with a stack of nanosheets disposed thereon, the stack of nanosheets having a layer of gate conductor material and inner spacers between each nanowire of the stack of nanosheets. A gate structure including a gate conductor and gate spacers is disposed on the stack of nanosheets. Source and drain regions are disposed on opposing sides of the stack of nano sheets in contact with ends of the nanosheets. A layer of isolation material is between the source and drain regions and the substrate. An interlevel dielectric buries the source and drain regions. Contacts are in contact with the source and drain regions and exposed through the interlevel dielectric.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
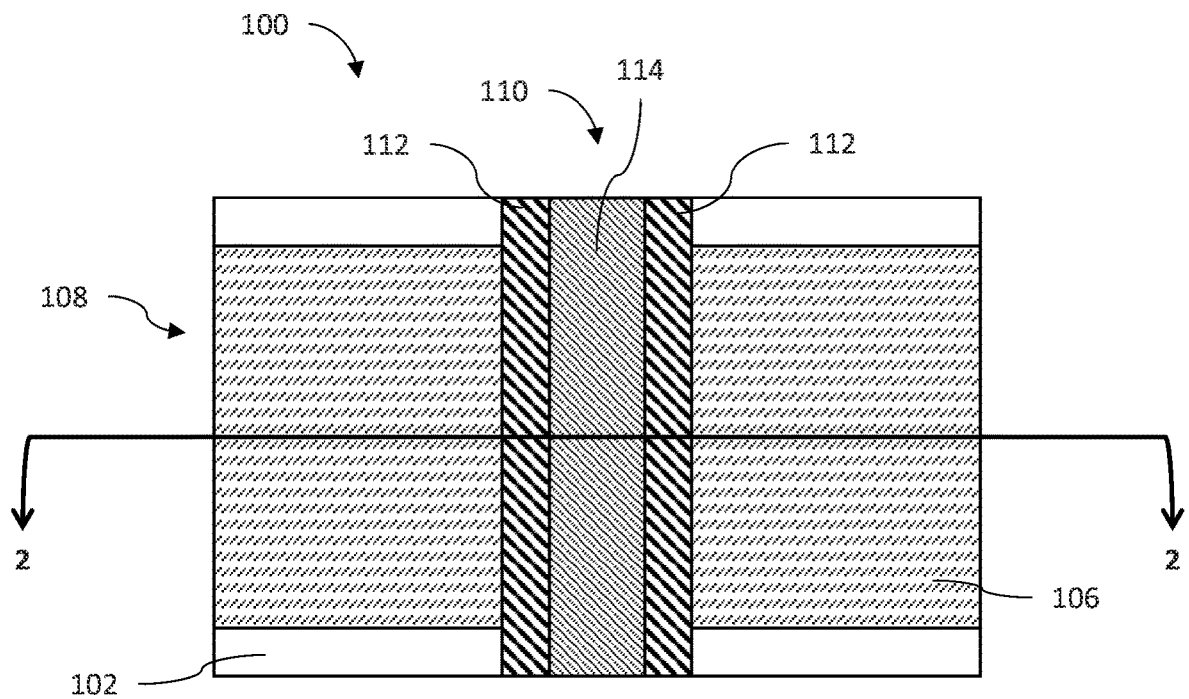
FIG. 1 is a top view showing a semiconductor device including a gate structure over alternating nanosheets, in accordance with an embodiment of the present invention.

According to an embodiment of the present invention, a sacrificial layer is formed over a substrate to improve the growth of source and drain regions. Thus, a gate structure is formed on the substrate and the sacrificial layer is formed to each side of the gate structure on a surface of the substrate. As a result, the source and drain regions can be grown from the sacrificial layer, as well as, e.g., a fin, including semiconductor nanosheets. Because of the sacrificial layer, the growth surface for the source and drain regions are increased, improving the speed and quality of growth.

Upon growth the source and drain regions, the sacrificial layer can be removed and replaced with an insulating material. As a result, an insulator is formed between the source and drain regions and the substrate. The insulator can improve isolation of the source and drain regions from each other and from other components by inhibiting current leakage through the substrate. As a result, device performance can be improved, with less parasitic loss and current leakage, leading to more efficient, faster switching devices.

Because of the improved source and drain quality due to the sacrificial layer and the improved isolation of the source and drain regions, devices can be made smaller without compromising reliability and performance.

Exemplary applications/uses to which the present invention can be applied include, but are not limited to: semiconductor devices and fabrication thereof, including transistors, such as, fin field effect transistors and vertical field effect transistors, that benefit from improved source and drain growth and isolation.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a top view showing a semiconductor device including a gate structure over alternating nanosheets is illustrated according to an embodiment of the present invention.

According to an embodiment of the present invention, a semiconductor device 100 is provided with at least a dummy gate structure 110 formed over a substrate 102 with a fin 108 formed thereon. A top of the fin 108 can include a nanosheet 106. The nanosheet 106 can include, e.g., a semiconductor material, such as, silicon (Si), silicon germanium (SiGe), silicon germanium carbide (SiGeC), silicon carbon (SiC) and multi-layers thereof. Alternative semiconductor materials can also be employed, such as, but not limited to, germanium (Ge), gallium arsenide (GaAs), gallium nitride (GaN), cadmium telluride (CdTe), zinc selenide (ZnSe), etc. As will be described below, the nanosheet 106 can be one of multiple nanosheets on a substrate, such as, e.g., two or more alternating nanosheets. Thus, the dummy gate structure 110 is formed over and around the nanosheet 106 of the fin 108 on the substrate 102.

Multiple fins can be formed across the substrate 102 in this fashion, each fin 108 parallel to each other with one or more dummy gate structures 110 formed transverse to and extending across each of the fins 108. The fins 108 are separated by a shallow trench isolation region (not shown) between each fin to isolate the fins 108 from each other.

The fin 108 can be formed by epitaxial growth and/or directional etching, for example, by reactive ion etching (RIE). In various embodiments, the fin 108 can be formed by an image transfer process, for example, a sidewall image transfer (SIT), also referred to as Self-Aligned Double Patterning (SADP), a Self-aligned triple patterning (SATP) process, a Self-Aligned Quadruple Patterning (SAQP) process, or a combination thereof. In various embodiments, the fin 108 can be formed by a direct-write process, for example, using extreme ultraviolet (EUV) lithography, electron beam lithography, or x-ray lithography. In general, non-limiting range for each alternating layer of multilayered nanosheet 106 can be patterned into multiple fins. For example, the fin 108 shown in the top view FIG. 1 may contain a plurality of parallel fins under the dummy gate structure 110.

The dummy gate structure 110 can include a dummy structure for a gate-last process. Therefore, the dummy gate structure 110 includes a dummy gate 114 between sidewall spacers 112. The dummy gate 114 is formed on the channel portion of the nanosheet 106. As used herein, the term "dummy gate 114" denotes a sacrificial structure that dictates the geometry and location of the later formed functioning gate structure. The sacrificial material that provides the dummy gate 114 may be composed of any material that can be etched selectively to the underlying nanosheet 106. In one embodiment, the sacrificial material that provides the dummy gate 114 may be composed of a silicon-containing material, such as polysilicon. Although, the dummy gate 114 is typically composed of a semiconductor material, the dummy gate 114 may also be composed of a dielectric material, such as an oxide, nitride or oxynitride material, or amorphous carbon.

The sacrificial material may be patterned and etched to provide the dummy gate 114. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections if the sacrificial material covered by the photoresist are protected to provide the dummy gate 114, while the exposed regions are removed using a selective etching process that removes the unprotected regions. Following formation of the dummy gate 114, the photoresist may be removed.

At least one dielectric gate spacer 112 can then be formed adjacent to the dummy gate 114, i.e., in direct contact with the sidewall of the dummy gate 114. In one embodiment, the at last one dielectric gate spacer 112 can be formed by using a blanket layer deposition, such as chemical vapor deposition, and an anisotropic etchback method. The at least one dielectric gate spacer 112 can be composed of a dielectric, such as a nitride, oxide, oxynitride, or a combination thereof. The dielectric gate spacer 112 is optional, and may be omitted.

Figure 2:
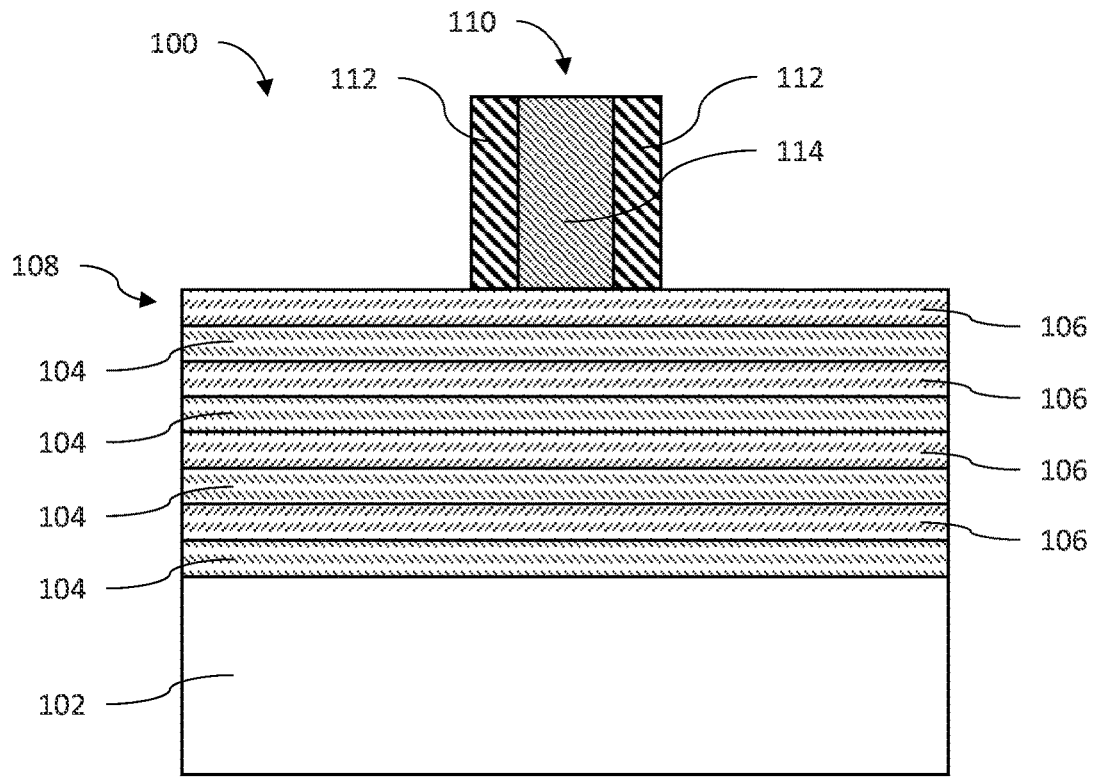
FIG. 2 is a cross-sectional view showing a semiconductor device including a gate structure over alternating nanosheets from the cross-section 2-2 of FIG. 1, in accordance with an embodiment of the present invention.

Referring now to FIG. 2, a cross-sectional view showing a semiconductor device including a gate structure over alternating nanosheets fins from the cross-section 2-2 (through center of one of the fins) of FIG. 1 is illustrated according to an embodiment of the present invention.

As described above, the dummy gate structure 110 is formed on the fin 108. The fin 108 includes the nanosheet 106 and can include at least one other nanosheet 104. The nanosheet 104 can be a sacrificial nanosheet 104 where, e.g., multiple of each of nanosheet 106 and the sacrificial nanosheet 104 are formed in alternating fashion on a substrate 102 to form the fin 108. The nanosheets 104 can be sacrificial nanosheets formed of a semiconductor material. The nanosheets 104 can include a semiconductor material with differing etch selectivity relative to the substrate 102 and the nanosheets 106. As an example, the nanosheet stack can include a first material for nanosheets 106 that can include Si, and a second material for sacrificial nanosheets 104, including a sacrificial semiconductor material such as, e.g., SiGe. The nanosheets 106 and the sacrificial nanosheets 104 can be deposited in alternating fashion to form desired number of layered nanosheets (for example, two layers of each of the nanosheets 106 and sacrificial nanosheets 104).

The nanosheet stack can be formed, e.g., from a series of deposition processes, layering each of the first and at least second material in alternating fashion. The deposition processes can include, e.g., physical vapor deposition (PVD), chemical vapor deposition (CVD), molecular beam epitaxy (MBE) and, atomic layer deposition (ALD) among others.

The semiconductor device 100 is shown in accordance with one embodiment. The device 100 includes a substrate 102 having multiple layers formed thereon. The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc. According to one possible embodiment, the substrate 102 includes a same material as the nanosheet 106 material. Thus, the sacrificial nanosheets 104 are etchable selective to both the substrate 102 and the nanosheets 106.

Figure 3:
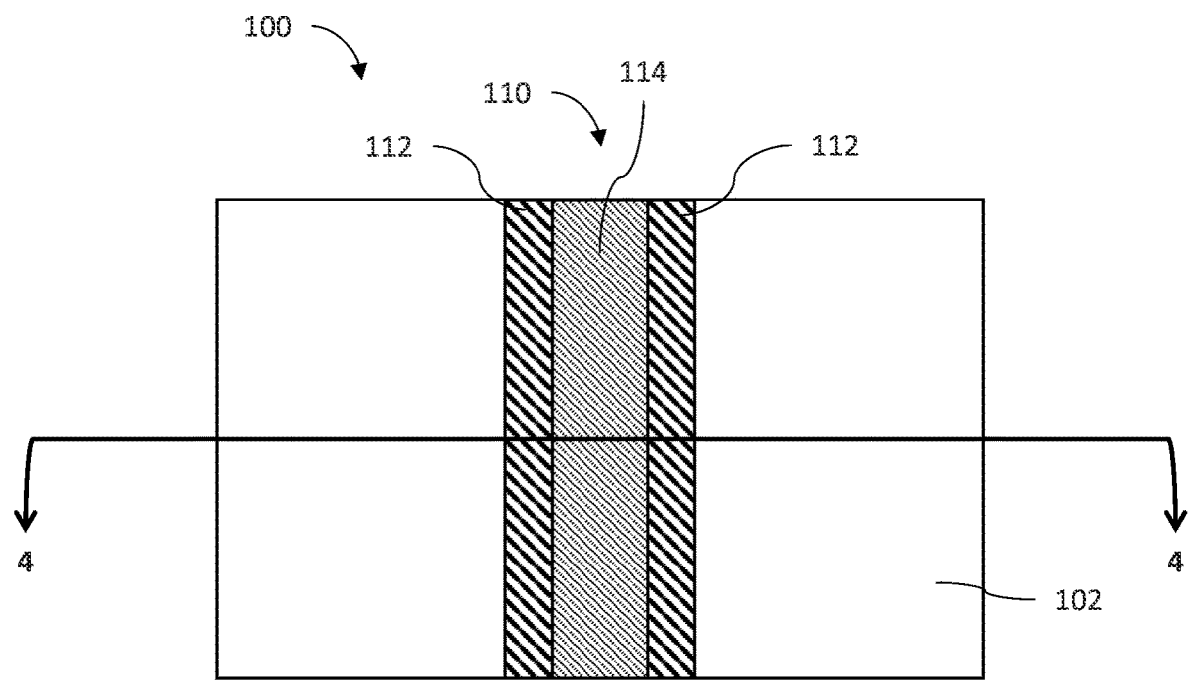
FIG. 3 is a top view showing a semiconductor having a gate structure over a nanowire fin, in accordance with an embodiment of the present invention.

Referring now to FIG. 3, a top view showing a semiconductor having a gate structure over a nanowire fin is illustrated according to an embodiment of the present invention.

The nanosheets 104 and 106 can be recessed to expose the substrate 102 from above. In particular, the stack of nanosheets 104 and 106 can be patterned using the gate structure 110 as a mask for patterning. Thus, the nanosheets 104 and 106 extending beyond a footprint of the gate structure 110 can be removed. As a result, from a top view, the substrate 102 is visible to each side of the gate structure 110.

In particular, according to one embodiment, the fin 108 is recessed using selective etching, such as, e.g., anisotropic etching. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation.

Figure 4:
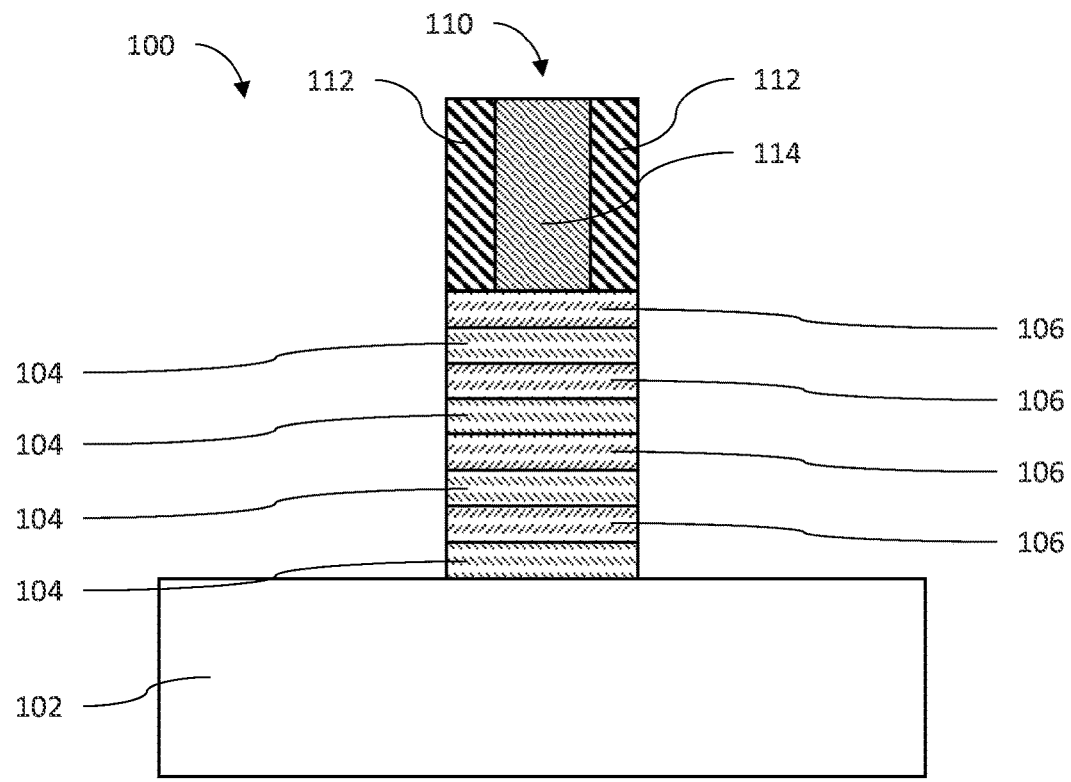
FIG. 4 is a cross-sectional view showing a semiconductor having a gate structure over a nanowire fin from the cross-section 4-4 of FIG. 3, in accordance with an embodiment of the present invention.

Referring now to FIG. 4, a cross-sectional view showing a semiconductor having a gate structure over a nanowire fin from the cross-section 4-4 of FIG. 3 is illustrated according to an embodiment of the present invention.

As described above with reference to FIG. 3, the fin 108 is recessed to be coextensive with a footprint of the dummy gate structure 110 on the substrate 102. As such, the nanosheets 106 and sacrificial nanosheets 104 are each recessed. According to embodiments of the present invention, the nanosheets 104 and 106 are recessed using an etch process, such as, e.g., RIE. The etch process uses an etch chemistry that is selective to the substrate 102, the dummy gate 114 and the gate spacers 112. As a result, the dummy gate structure 110 can be used as a mask during etching to remove material from the nanosheets 106 and the sacrificial nanosheets 104 extending beyond the dummy gate structure 110 while preserving the substrate 102. As a result, the nanosheets 104 and 106 are converted into alternating sacrificial nanosheets 104 and nanosheets 106 within a channel region beneath the dummy gate structure 110.

Figure 5:
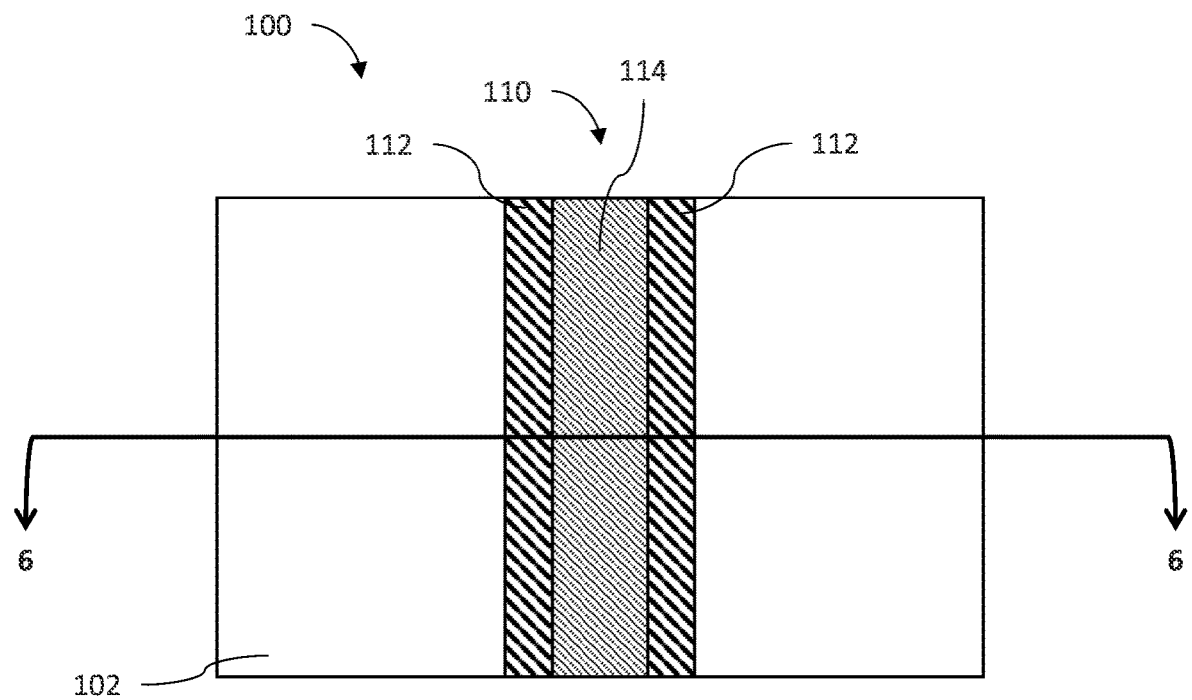
FIG. 5 is a top view showing a semiconductor having a gate structure over a nanowire fin with recessed nanosheets, in accordance with an embodiment of the present invention.

Referring now to FIG. 5, a top view showing a semiconductor having a gate structure over a nanowire fin with recessed nanosheets is illustrated according to an embodiment of the present invention.

According to aspects of the present invention, one or more sets of nanosheets in the stack of nanosheets 104 and 106 are recessed relative to the other nanosheets. In particular, the sacrificial nanosheets 104 are recessed to a width less than a width of the nanosheets 106. However, because the sacrificial nanosheets 104 are recessed to the width less than the width of the nanosheets 106, which are coextensive in width, as described above, with the dummy gate structure 110, from a top view, the recessing of the sacrificial nanosheets 104 is not visible. Thus, the dummy gate structure 110 extends across a top surface of the substrate 102, obscuring the nanosheets 106 and the sacrificial nanosheets 104 beneath the dummy gate structure 110, between the dummy gate structure 110 and the top surface of the substrate 102.

Figure 6:
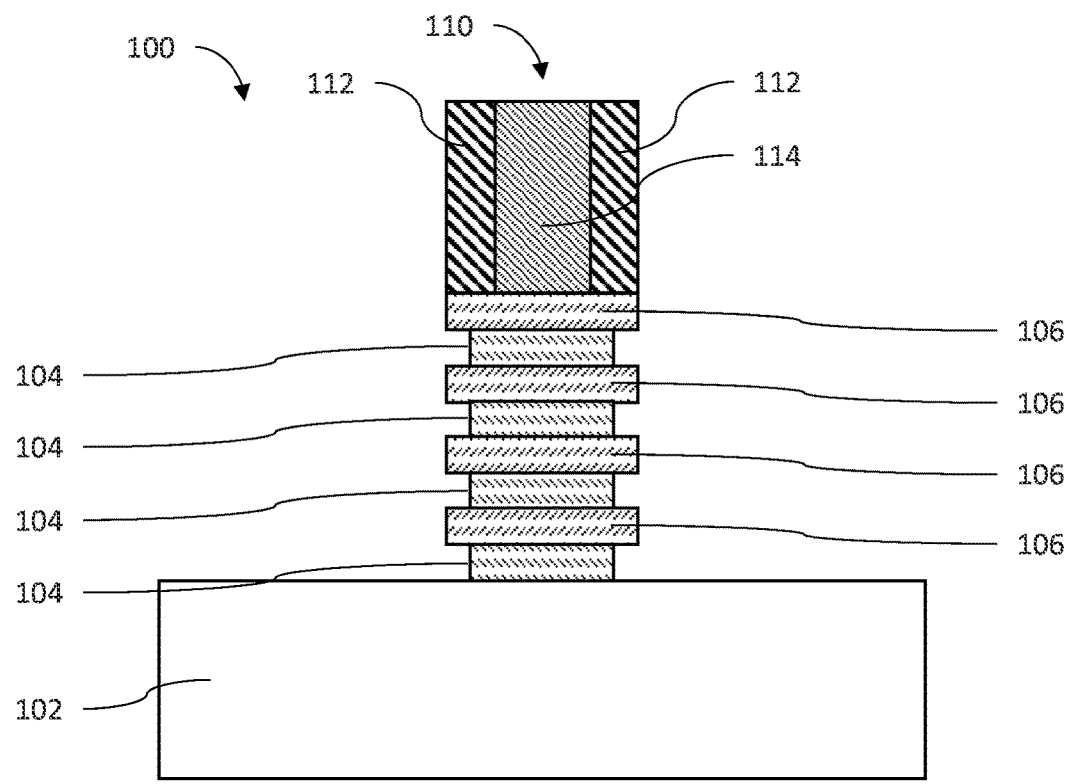
FIG. 6 is a cross-sectional view showing a gate structure over a nanowire fin with recessed nanosheets from the cross-section 6-6 of FIG. 5, in accordance with an embodiment of the present invention.

Referring now to FIG. 6, a cross-sectional view showing a gate structure over a nanowire fin with recessed nanosheets from the cross-section 6-6 of FIG. 5 is illustrated according to an embodiment of the present invention.

As described above with reference to FIG. 5, the sacrificial nanosheets 104 are recessed to a width less than a width of the nanosheets 106 and the dummy gate structure 110. The sacrificial nanosheets 104 can be recessed using, e.g., a selective etch process, such as, e.g., an isotropic etch process. The term "isotropic etch" denotes an etch process that is non-directional. By "non-directional" it is meant that the etch rate is not substantially greater in any one direction in comparison to all of the etch directions. The isotropic etch may be a wet chemical etch or a dry etch. For example, the etchant may be a corrosive liquid or a chemically active ionized gas, such as a plasma. In the case where the sacrificial layer 104 comprise SiGe, the etch process can be, for example, gas phase hydrogen chloride etch, a wet etch process containing a mix of ammonia and hydrogen peroxide, or a dry etch such as plasma etch.

The etch process can be selective to the substrate 102, the nanosheets 106, the gate spacers 112 and dummy gate material 114. Therefore, the etch process is tailored to selectively etch the sacrificial nanosheets 104 without harming other components of the device 100. As a result, the sacrificial nanosheets 104 include a material different from materials of each other component. For example, the substrate 102 and the nanosheets 106 can include Si while the sacrificial nanosheets 104 include, e.g., SiGe. The presence of Ge in the sacrificial nanosheets 104 alters the reaction of the sacrificial nanosheets 104 to an etchant relative to Si alone, including the Si of the substrate and the nanosheets 106. By adjusting the time and etch chemistry, the sacrificial nanosheets 104 can, therefore, be recessed to a desired width without harm to the other components of the device 100. Other material choices are also contemplated that facilitate selective recessing of the sacrificial nanosheets 104.

Figure 7:
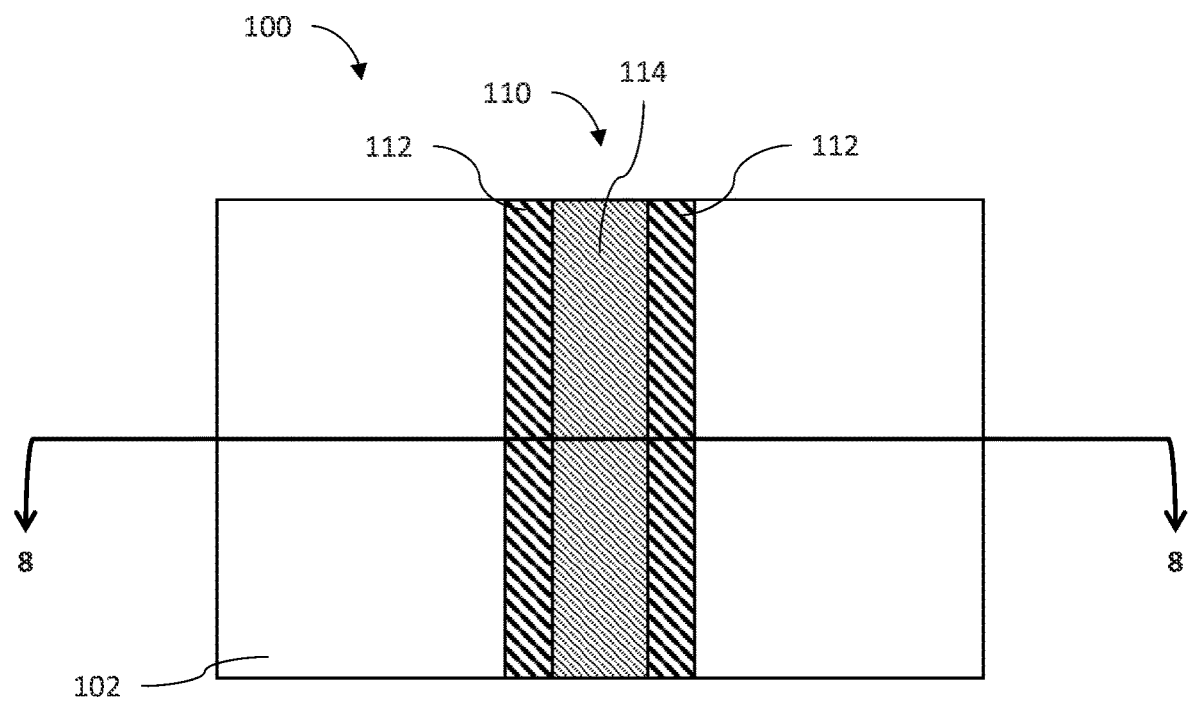
FIG. 7 is a top view showing a gate structure of a semiconductor device over stacked nanosheets with inner spacers, in accordance with an embodiment of the present invention.

Referring now to FIG. 7, a top view showing a gate structure of a semiconductor device over stacked nanosheets with inner spacers is illustrated according to an embodiment of the present invention.

According to an embodiment of the present invention, gaps created from recessing the sacrificial nanosheets 104 are filled to align with the width of the nanosheets 106 and the dummy gate structure 110. Thus, the dummy gate structure 110 extends across the substrate 102 with a stack of alternating nanosheets 104 and 106 between the dummy gate structure 110 and the substrate 102. The sacrificial nanosheets 104 include inner spacers at each end of the sacrificial nanosheets 104 that are within the width of the dummy gate structure 110, and thus not viewable form above.

Figure 8:
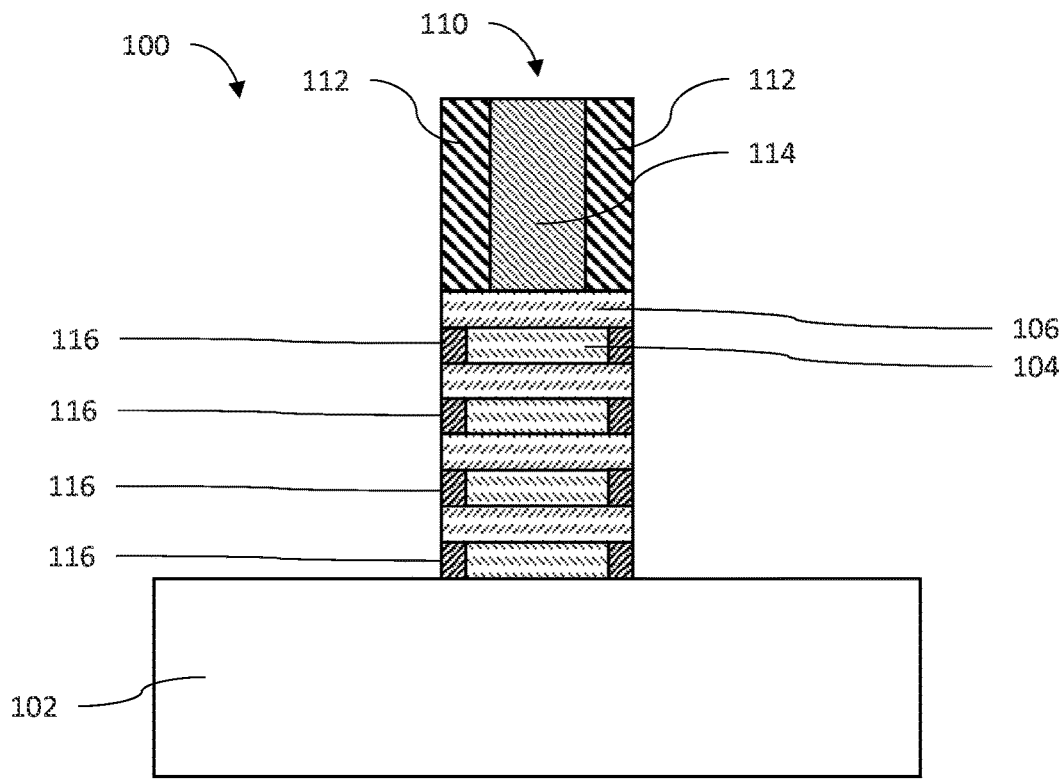
FIG. 8 is a cross-sectional view showing a gate structure of a semiconductor device over stacked nanosheets with inner spacers from the cross-section 8-8 of FIG. 7, in accordance with an embodiment of the present invention.

Referring now to FIG. 8, a cross-sectional view showing a gate structure of a semiconductor device over stacked nanosheets with inner spacers from the cross-section 8-8 of FIG. 7 is illustrated according to an embodiment of the present invention.

As described above with reference to FIG. 7, gaps or divots at ends of the sacrificial nanosheets 104 formed by the reduced width of the sacrificial nanosheets 104 relative to the nanosheets 106 are filled with inner spacers 116. Similar to the gate spacers 112, the inner spacers 116 can include, e.g., a dielectric material such as silicon oxide (SiO$_2$), silicon nitride (SiN) or other oxide or nitride.

In one embodiment, the inner spacers 116 can be formed by using a blanket layer deposition, such as chemical vapor deposition, and an anisotropic etchback method. Similar to the recessing of the nanosheets of the fin 108 described above, the use of the anisotropic process can be implemented with the dummy gate structure 110 as a mask. As a result, outer surfaces of the inner spacers 116, opposite to surfaces of the inner spacers 116 in contact with the sacrificial nanosheets 104, are aligned with outer surfaces of the gate spacers 112, opposite to surfaces of gate spacers 112 in contact with the dummy gate material 114.

Figure 9:
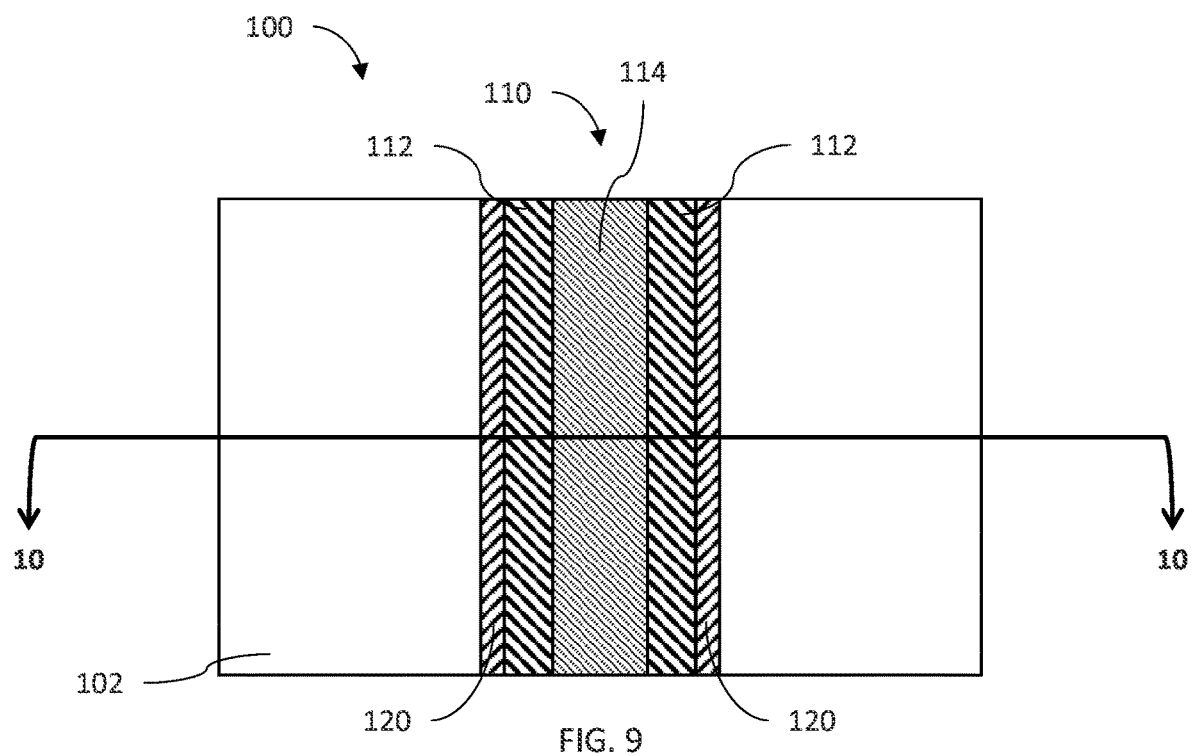
FIG. 9 is a top view showing hardmasks on outer sidewalls of a gate structure of a semiconductor device over stacked nanosheets with inner spacers, in accordance with an embodiment of the present invention.

Referring now to FIG. 9, a top view showing hardmasks on outer sidewalls of a gate structure of a semiconductor device over stacked nanosheets with inner spacers is illustrated according to an embodiment of the present invention.

According to an embodiment of the present invention, a sidewall hardmask 120 is formed on sidewalls of the dummy gate structure 110 and the stack of nanosheets 104 and 106. The sidewall hardmask 120 seals the ends of the nano sheets 104 and 106 to protect the nanosheets 104 and 106, the inner spacers 116 and the dummy gate structure 110 from subsequent processing, such as, e.g., depositions and etchings. Accordingly, the sidewall hardmask 120 can be an insulating, semiconductive or conductive material with differing selectivity relative to the other components of the device 100. In one embodiment, the sidewall hardmask 120 includes, e.g., a nitride, such as, e.g., SiN.

In one embodiment, the sidewall hardmask 120 can be formed by using a blanket layer deposition, such as chemical vapor deposition, or a conformal deposition, such as atomic layer deposition, and an anisotropic etchback method, such as, e.g., RIE. As a result, a thin nitride layer is formed along the sides of the dummy gate structure 110, including the underlying stack of nanosheets 104 and 106, across the substrate 102.

Figure 10:
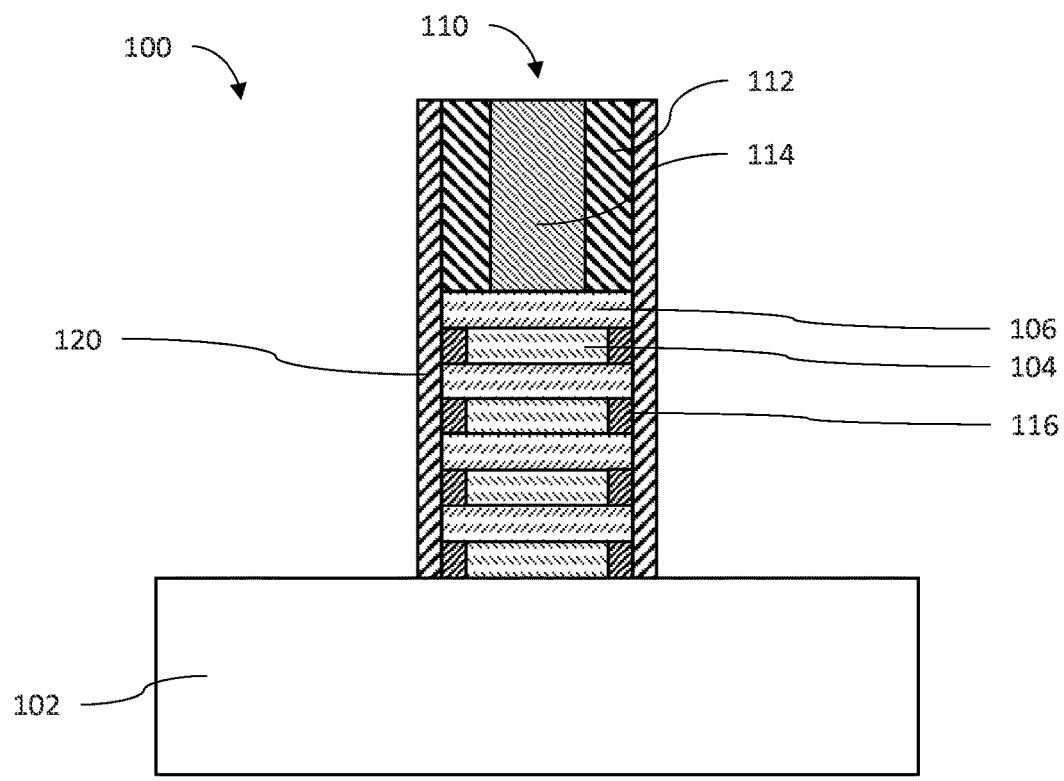
FIG. 10 is a cross-sectional view showing hardmasks on outer sidewalls of a gate structure of a semiconductor device over stacked nanosheets with inner spacers from the cross-section 10-10 of FIG. 9, in accordance with an embodiment of the present invention.

Referring now to FIG. 10, a cross-sectional view showing hardmasks on outer sidewalls of a gate structure of a semiconductor device over stacked nanosheets with inner spacers from the cross-section 10-10 of FIG. 9 is illustrated according to an embodiment of the present invention.

The sidewall hardmask 120 extends along the sidewalls of both the dummy gate structure 110 and the stack of the nanosheets 104 and 106. The deposition and etch process removes horizontal portions of deposited material to form the vertical sidewall hardmark 120. As a result, the sidewall hardmask 120 extends along vertical portions of the device 100 from the substrate 102 at the bottom, to a top surface of the dummy gate structure 110. Thus, the nanosheets 104 and 106, along with the inner spacers 116 are sealed between the sidewall hardmask 120 on the sides, the dummy gate structure 110 on top and the substrate on bottom 102. Thus, the nanosheets 104 and 106 are fully protected from subsequent processing, such as, e.g., deposition and etching processes.

Figure 11:
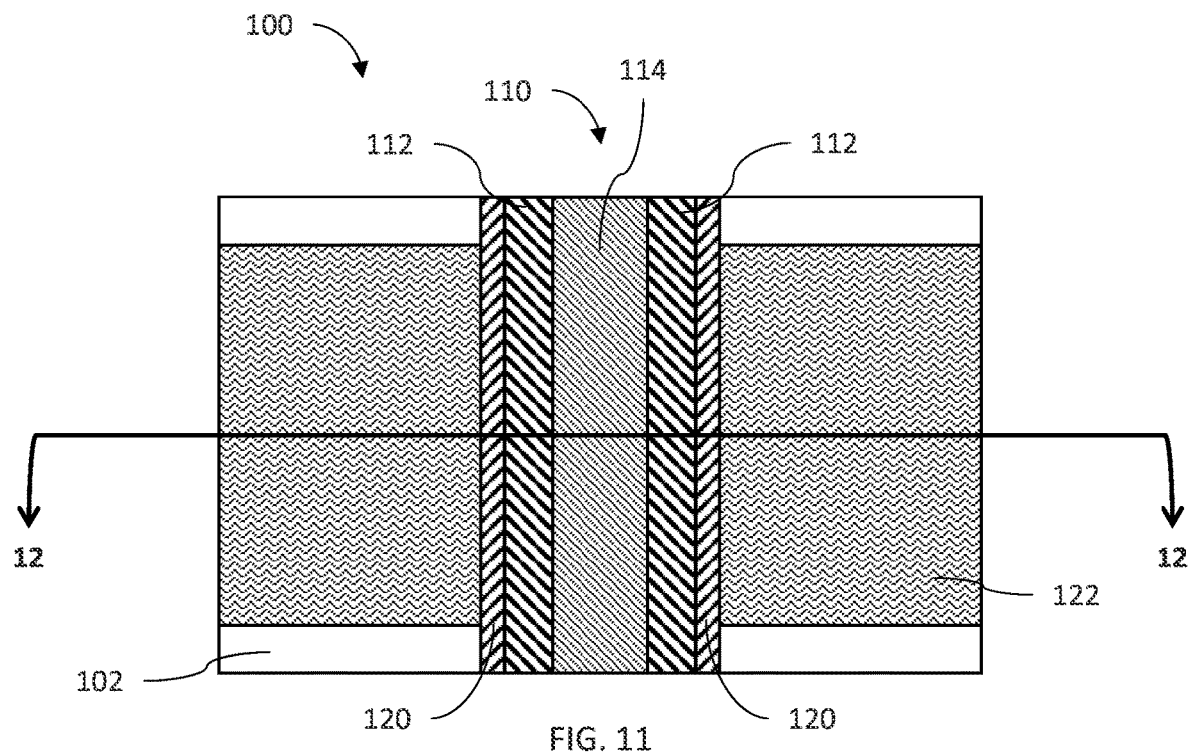
FIG. 11 is a top view showing hardmasks on outer sidewalls of a gate structure of a semiconductor device and a growth layer over a substrate, in accordance with an embodiment of the present invention.

Referring now to FIG. 11, a top view showing hardmasks on outer sidewalls of a gate structure of a semiconductor device and a growth layer over a substrate is illustrated according to an embodiment of the present invention.

According to an embodiment of the present invention, a sacrificial semiconductor layer 122 is formed over the substrate 102. The sacrificial semiconductor layer 122 can be removed in later processing. Therefore, the sacrificial semiconductor layer 122 includes a material that is selectively etchable to other materials of the device 100, such as, e.g., the substrate 102, the dummy gate material 114, the gate spacers 112, the sidewall hardmask 120, the nanosheets 104 and 106 and the inner spacers 116. The sacrificial semiconductor layer 122 can, therefore, include a material, such as, e.g., a semiconductor different from the semiconductors of the substrate 102 and the nanosheets 104 and 106.

According to one possible embodiment, the sacrificial semiconductor material 122 includes, e.g., SiGe with a high percentage of germanium. In particular, the sacrificial semiconductor material 122 includes a higher percentage of germanium than the SiGe used for the sacrificial nanosheets 104. Thus, the sacrificial semiconductor layer 122 and the sacrificial nanosheets 104 can be processed selective to each other.

The sacrificial semiconductor layer 122 can be formed using a suitable deposition process, such as, e.g., chemical vapor deposition or a selective deposition process. The sacrificial semiconductor layer 122 can be, e.g., blanket deposited across the semiconductor device 100 and etched with an etch processing using, e.g., anisotropic etching selective to the materials of the dummy gate structure 110, the sidewall hardmask 120 and the substrate 102. Thus, the sacrificial semiconductor layer 122 can be removed from surfaces of the dummy gate structure 110. However, if a selective deposition process is used, the sacrificial semiconductor 122 can be deposited across the substrate 102 selective to the sidewall hardmask 120 and the dummy gate structure 110. In one example embodiment, the sacrificial semiconductor layer 122 can be SiGe with a high percentage of germanium, and grown on the exposed top surface of the substrate 102 by selective epitaxial growth method.

Accordingly, a layer of the sacrificial semiconductor layer 122 is formed across the substrate 102, with the dummy gate structure exposed. The sacrificial semiconductor layer 122 can be patterned to cover source and drain regions over the substrate 102 on each side of the dummy gate structure 110 using a suitable patterning technique, such as, e.g., photolithography and etching. Thus, a source and drain region can be grown from the sacrificial semiconductor layer 122 in a pre-patterned fashion. However, the sacrificial semiconductor layer 122 can, alternatively, be formed as a blanket across the substrate 102.

Figure 12:
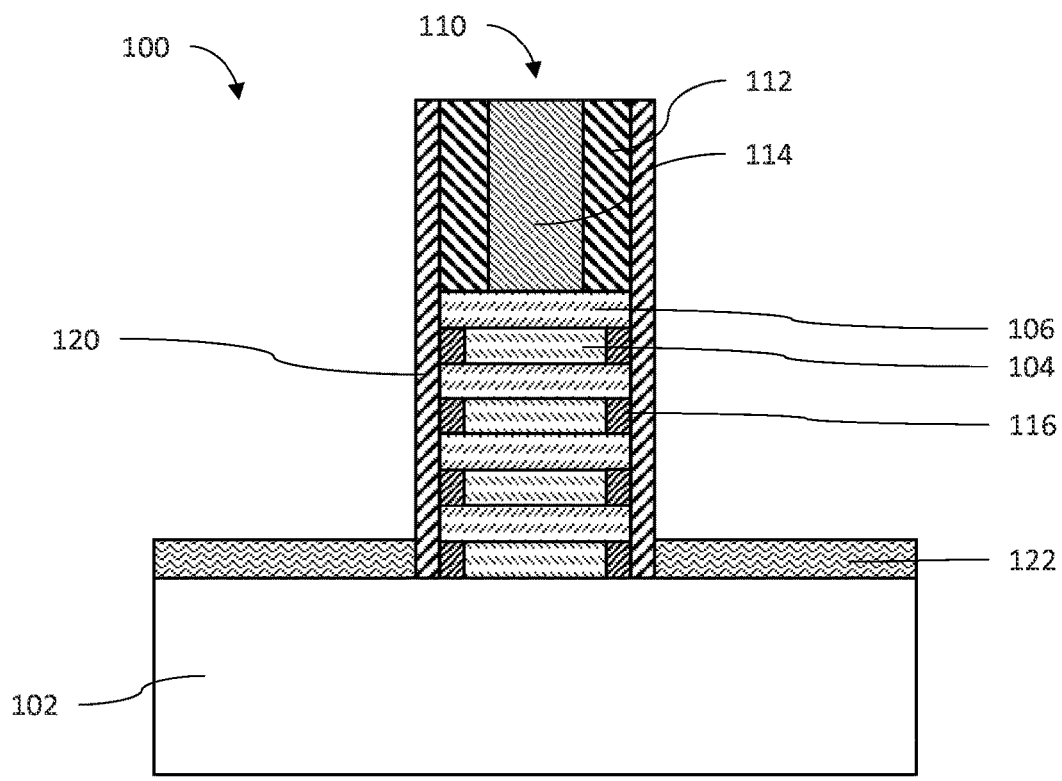
FIG. 12 is a cross-sectional view showing hardmasks on outer sidewalls of a gate structure of a semiconductor device and a growth layer over a substrate from the cross-section 12-12 of FIG. 11, in accordance with an embodiment of the present invention.

Referring now to FIG. 12, a cross-sectional view showing hardmasks on outer sidewalls of a gate structure of a semiconductor device and a growth layer over a substrate from the cross-section 12-12 of FIG. 11 is illustrated according to an embodiment of the present invention.

The sacrificial semiconductor layer 122 is formed over the substrate 102 on each side of the dummy gate structure 110. The sacrificial semiconductor layer 122 can be deposited to a height above a top surface of the substrate 102 that is up to or below a bottom-most nanowire 106. According to an embodiment of the present invention, the nanosheets 106 can form channels for current during operation of the device 100. Thus, the nanosheets 106 are in contact with source and drain regions on each side of the dummy gate structure 110. To facilitate this contact, the sacrificial semiconductor layer 122 is maintained at a thickness above the substrate 102 that extends below a top surface of the bottom-most nanowire 106 relative to the substrate 102. Put another way, the thickness above the substrate 102 of the sacrificial semiconductor layer 122 is less than a thickness above the substrate 102 of a combination of the bottom-most sacrificial nanowire 104 and the bottom-most nanowire 106. Thus, ends of the bottom-most nanowire 106 can be maintained above the sacrificial semiconductor layer 122.

Figure 13:
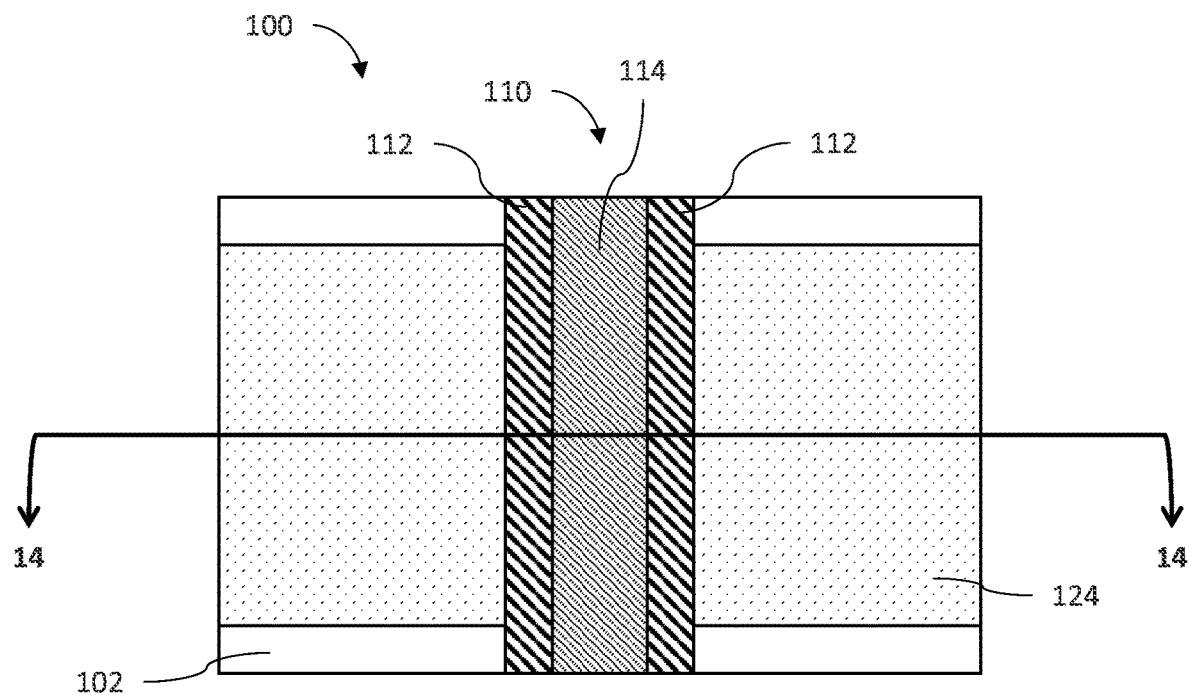
FIG. 13 is a top view showing a semiconductor device with source and drain regions grown from outer sidewalls of a gate structure and from a growth layer over a substrate, in accordance with an embodiment of the present invention.

Referring now to FIG. 13, a top view showing a semiconductor device with source and drain regions grown from outer sidewalls of a gate structure and from a growth layer over a substrate is illustrated according to an embodiment of the present invention.

According to an embodiment of the present invention, the sidewall hardmask 116 is removed from the sidewalls of the dummy gate structure 110. Removing the sidewall hardmask 116 exposes ends of the nano sheets 106, providing vertical surfaces for contacting source/drain regions 124. The vertical sidewalls of the nanosheets 106 and the vertical sidewalls of the gate spacers 112 opposite to surfaces of the gate dielectric in contact with the dummy gate material 114, are vertically aligned and perpendicular to a top surface of the substrate 102.

The source/drain region 124 are formed on each side of the dummy gate structure 110 over the sacrificial semiconductor layer 122. According to one possible embodiment of the present invention, formation of the source/drain regions 124 is performed more quickly and reliably by using the sacrificial semiconductor layer 122 to seed epitaxial growth. By using epitaxial growth to form the source/drain regions 124, the source/drain regions 124 can be grown from both the vertical sidewalls of the nanosheets 106 as well as the sacrificial semiconductor layer 122, thus vastly increasing the surface area from which a material of the source/drain regions 124 is grown.

Source/drain region 124 epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Figure 14:
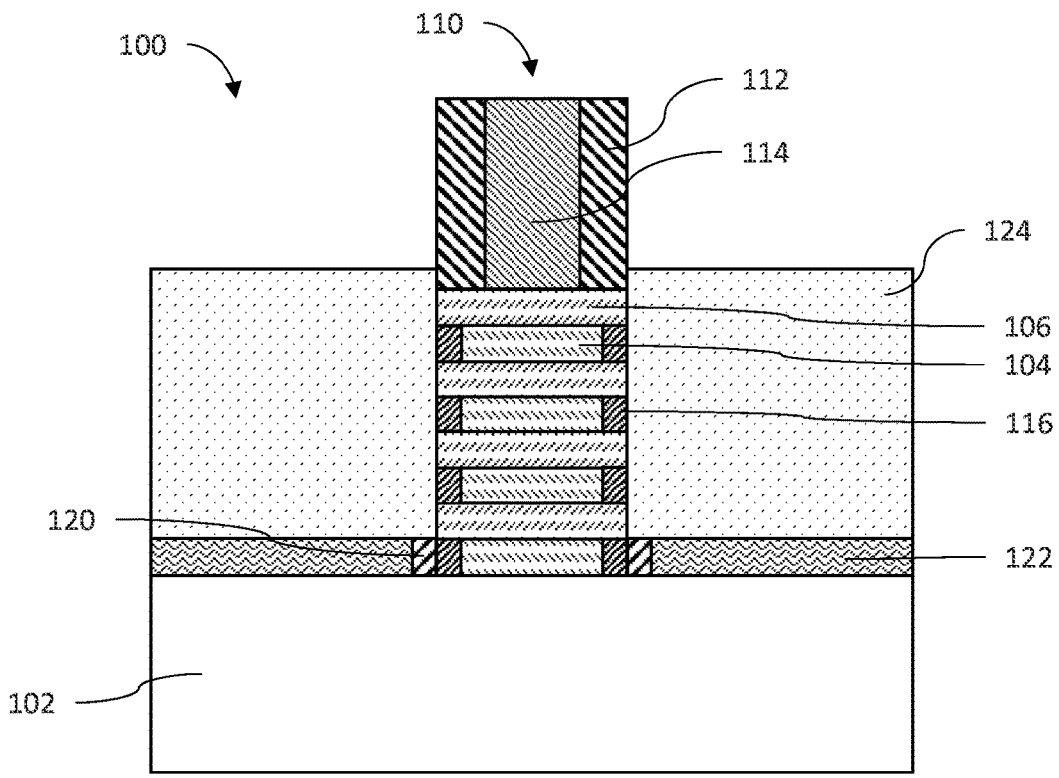
FIG. 14 is a cross-sectional view showing a semiconductor device with source and drain regions grown from outer sidewalls of a gate structure and from a growth layer over a substrate from the cross-section 14-14 of FIG. 13, in accordance with an embodiment of the present invention.

Referring now to FIG. 14, a cross-sectional view showing a semiconductor device with source and drain regions grown from outer sidewalls of a gate structure and from a growth layer over a substrate from the cross-section 14-14 of FIG. 13 is illustrated according to an embodiment of the present invention.

As described above, the source/drain regions 124 are epitaxially grown from both the sacrificial semiconductor layer 122 and vertical surfaces at ends of the nanosheets 106. Growth of the source/drain regions 124 can be continued until the source/drain regions 124 reach a thickness over the sacrificial semiconductor layer 122 that is greater than a distance between a top surface of the sacrificial semiconductor layer 122 and a bottom surface of the gate spacers 112. In particular, growth is continued until the vertical surfaces at the ends of each nanowire 106 is below a top surface of the source/drain regions 124. Thus, each nanowire 106 extends from a source/drain region 124 on one side of the dummy gate structure 110 to a source/drain region 124 on the opposite side of the dummy gate structure 110, contacting both source/drain regions 124 with the vertical surfaces of the ends. As a result, each nanowire 106 forms a channel between the dummy gate structure 110 and the substrate 102 across which a current can flow from source to drain.

Figure 15:
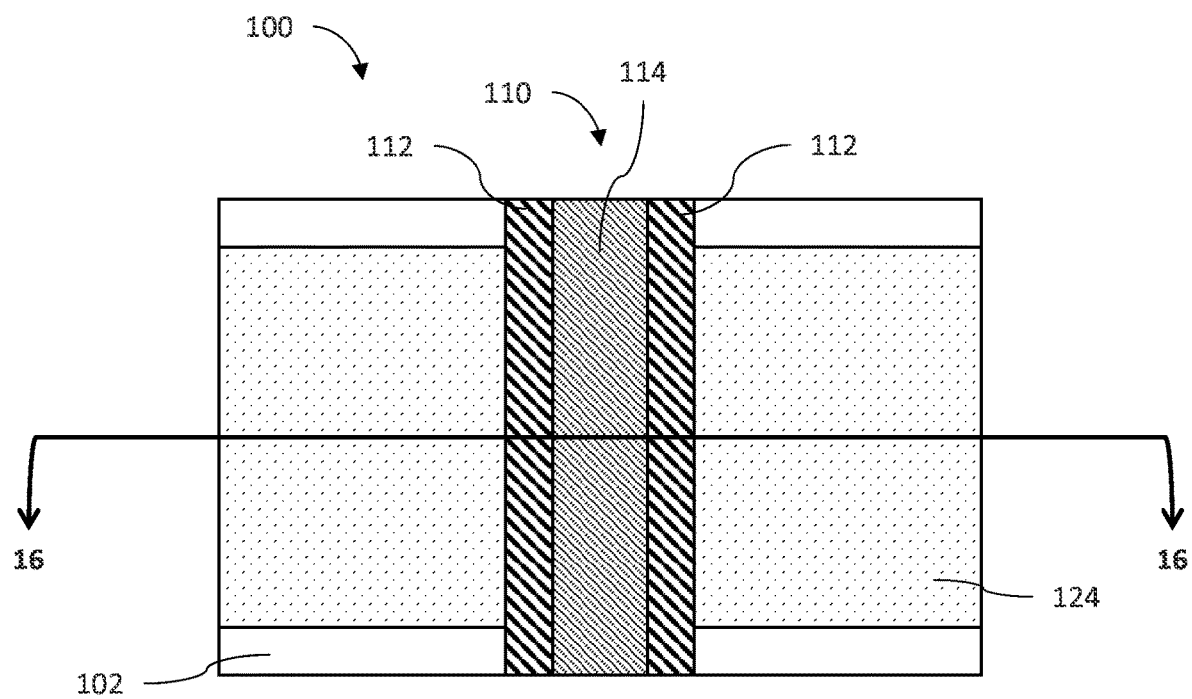
FIG. 15 is a top view showing a semiconductor device with source and drain regions on outer sidewalls of a gate structure and the growth layer removed from between the source and drain regions and a substrate, in accordance with an embodiment of the present invention.

Referring now to FIG. 15, a top view showing a semiconductor device with source and drain regions on outer sidewalls of a gate structure and the growth layer removed from between the source and drain regions and a substrate is illustrated according to an embodiment of the present invention.

The source/drain regions 124 are disposed over the substrate 102 on each side of the dummy gate structure 110. As described above, the source/drain regions 124 are grown from a sacrificial semiconductor layer 122 between the source/drain regions 124 and the substrate 102, along with ends of nanosheets 106 between the dummy gate structure 110 and the substrate 102. As a result, the source/drain regions 124 are connected to sides of the nanosheets 104. The sacrificial semiconductor substrate 122 can, therefore, be removed from the device 100 while the source/drain regions 124 are maintained over the substrate 102.

Figure 16:
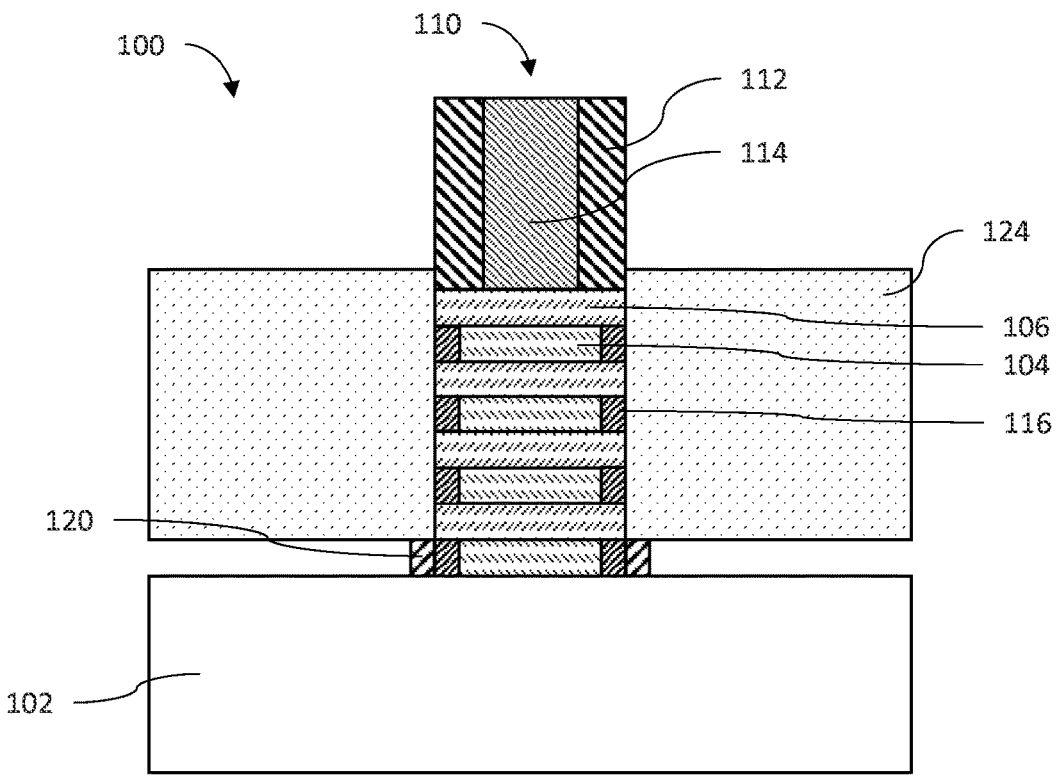
FIG. 16 is a cross-sectional view showing a semiconductor device with source and drain regions on outer sidewalls of a gate structure and the growth layer removed from between the source and drain regions and a substrate from the cross-section 16-16 of FIG. 15, in accordance with an embodiment of the present invention.

Referring now to FIG. 16, a cross-sectional view showing a semiconductor device with source and drain regions on outer sidewalls of a gate structure and the growth layer removed from between the source and drain regions and a substrate from the cross-section 16-16 of FIG. 15 is illustrated according to an embodiment of the present invention.

By removing the sacrificial semiconductor layer 122, a space between source/drain regions 124 and the substrate 102 can be produced. As a result, the source/drain regions 124 are separated from the substrate 102 by a thickness corresponding to a thickness of the removed sacrificial semiconductor layer 122.

The sacrificial semiconductor layer 122 is removed using, e.g., an isotropic etch process. The etch process can be designed to selectively etch the sacrificial semiconductor substrate 122 by, for example, using a chemistry that etches high germanium content SiGe, such as the SiGe used in the sacrificial semiconductor layer 122. As a result, the etch process is selective to the source/drain regions 124, the substrate 102, the sidewall hardmasks 120 and the dummy gate structure 110. Because the nanosheets 104 and 106 and the inner spacers 116 are sealed within an area between the source/drain regions 124 and sidewall hardmasks 120, and between the dummy gate structure 110 and the substrate 102, the nanosheets 104 and 106 are protected from the etching.

However, even where nanosheets 104 or 106 are exposed to the etchant, the nanosheets 104 and 106 can have different materials, such as, e.g., different germanium content, such that the nanosheets 104 and 106 are unharmed by the etchant. While an etch chemistry is described with reference to germanium containing materials, other materials can be used in the components of the device 100 such that the sacrificial semiconductor layer 122 can be etched selective to each other component to form the space between the source/drain regions 124 and the substrate 102.

Figure 17:
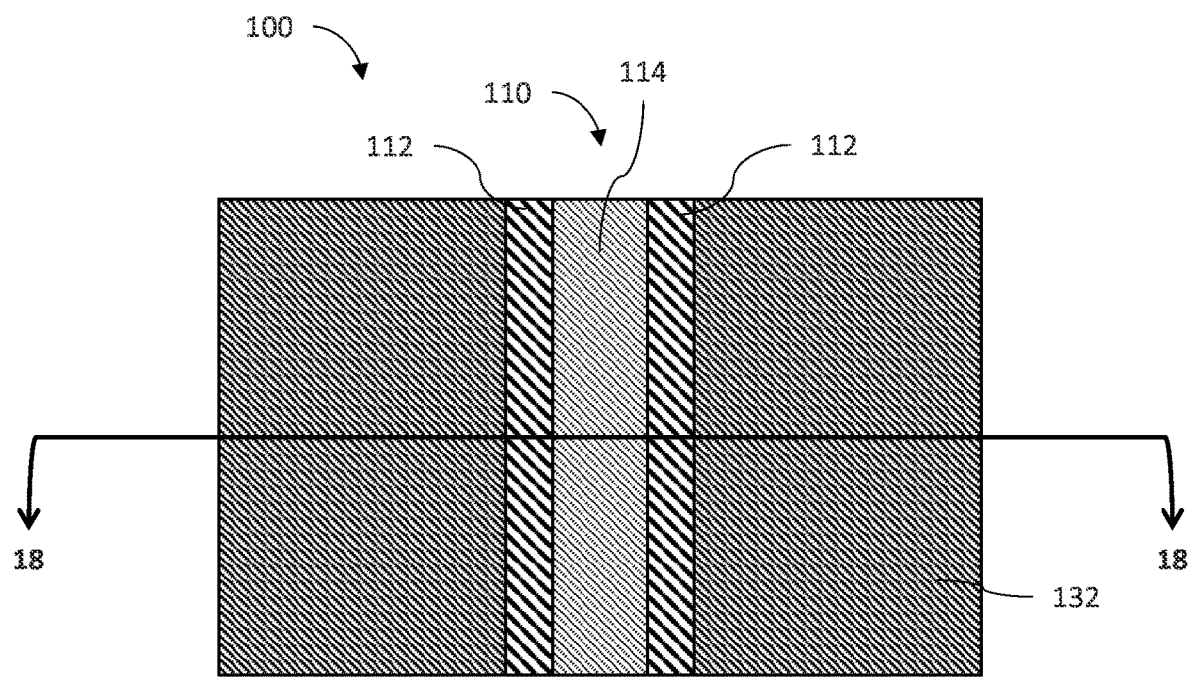
FIG. 17 is a top view showing a semiconductor device with source and drain regions on outer sidewalls of a gate structure and an isolation layer between the source and drain regions and a substrate from between the source and drain regions and a substrate, in accordance with an embodiment of the present invention.

Referring now to FIG. 17, a top view showing a semiconductor device with source and drain regions on outer sidewalls of a gate structure and an isolation layer between the source and drain regions and a substrate from between the source and drain regions and a substrate is illustrated according to an embodiment of the present invention.

According to an embodiment of the present invention, upon removing the sacrificial semiconductor layer 122 to form the space between the source/drain regions 124 and the substrate 102, the space is filled with an isolation material 130. The isolation material 130 can be restricted to the area between the source/drain region 124 and the substrate 102. In which case, the isolation material 130 is coextensive across the substrate 102 with the source/drain regions 124, and is completely covered by the source/drain regions 124. As a result, from a top view, the isolation material 130 is obscured by the source/drain regions 124.

To achieve this configuration, the isolation material 130 can be deposited with as a flowable isolation material, such as, e.g., a flowable oxide, including, e.g., $SiO_2$, or other suitable oxide. The isolation material 130 can be flowed into the gap and then patterned via, e.g., selective anisotropic etching including, e.g., RIE, to remove portions outside of the space between the source/drain regions 124 and the substrate 102.

However, according to aspects of the present invention, to reducing processing steps and improve efficiency and reliability, a flowable isolation material is deposited as a flowable oxide to form the isolation material 130 between the source/drain regions 124 and the substrate 102 concurrently with forming an interlevel dielectric layer (ILD) 132 overlying the source/drain regions 124, and planarizing the ILD 132 to be coplanar with an upper surface of the dummy gate structure 110. Thus, the source/drain regions 124 and substrate 102 are covered with the ILD 132, leaving the dummy gate structure 110 exposed.

Figure 18:
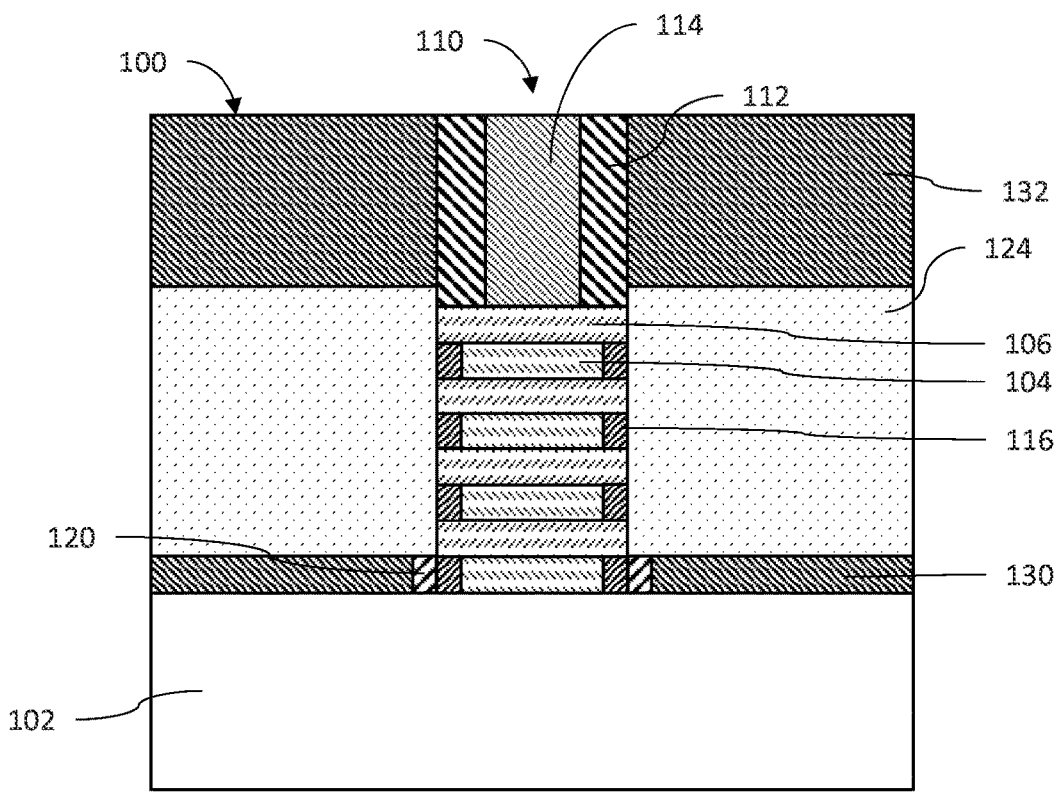
FIG. 18 is a cross-sectional view showing a semiconductor device with source and drain regions on outer sidewalls of a gate structure and an isolation layer between the source and drain regions and a substrate from the cross-section 18-18 of FIG. 17, in accordance with an embodiment of the present invention.

Referring now to FIG. 18, a cross-sectional view showing a semiconductor device with source and drain regions on outer sidewalls of a gate structure and an isolation layer between the source and drain regions and a substrate from the cross-section 18-18 of FIG. 17 is illustrated according to an embodiment of the present invention.

The ILD 132 and the isolation material 130 are formed concurrently to envelope the source/drain regions 124. As a result, the source/drain regions 124 are isolated from each side except a side in contact with the nanosheets 106. Thus, current leakage from the source/drain regions 124 can be reduced with improved isolation via the envelopment of the source/drain regions 124 with isolation material. In particular, providing isolation material 130 between the substrate 102 and the source/drain regions 124 insulated the substrate 102 from current in the source/drain regions 124 to prevent current leakage and parasitic losses through the substrate 102.

Figure 19:
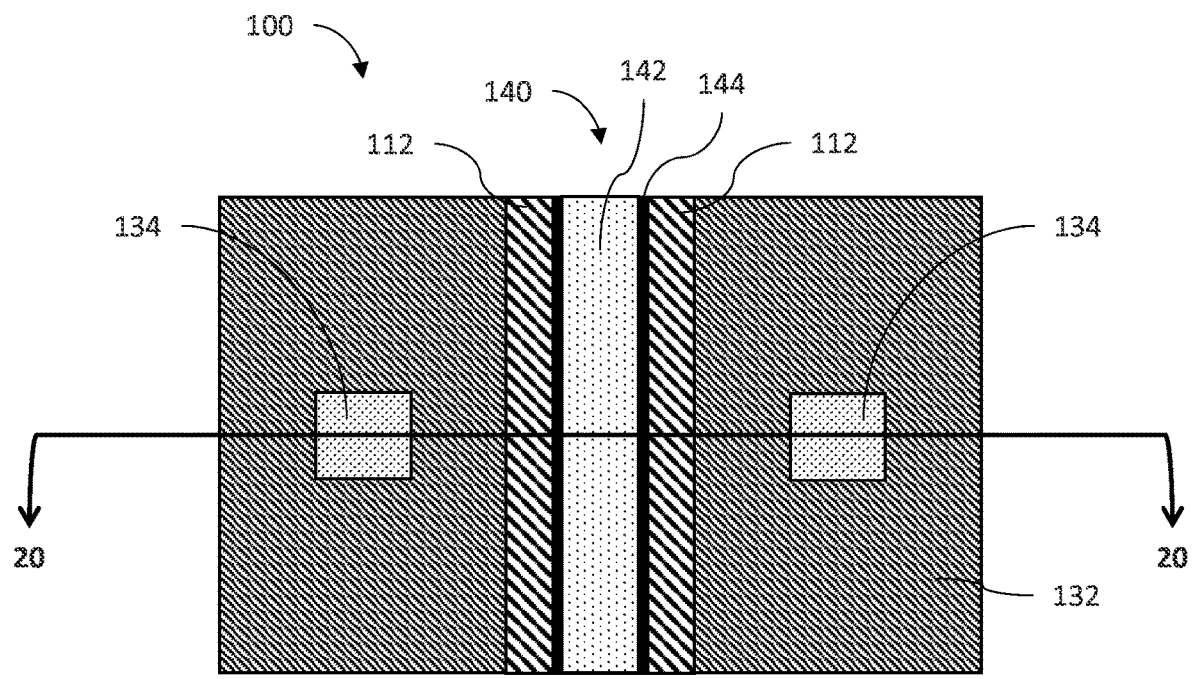
FIG. 19 is a top view showing a semiconductor device with an isolation layer between source and drain regions and substrate, in accordance with an embodiment of the present invention.

Referring now to FIG. 19, a top view showing a semiconductor device with an isolation layer between source and drain regions and substrate is illustrated according to an embodiment of the present invention.

According to an embodiment, the semiconductor device 100 is completed by replacing the dummy gate material 114 with a gate conductor 142 to create a gate structure 140. The dummy gate material 114 is replaced by selectively etching the dummy gate material 114 from between the gate spacers 112 down to the top-most nanowire 106 using, e.g., RIE. The resulting cavity between the gate spacers 112 can then be filled.

According to one possible embodiment, a gate dielectric 144 lines the interior of the cavity. To form the gate dielectric 144, a dielectric material is deposited conformally across the device 100 using, e.g., ALD. A top surface of the device 100 can be planarized, using, e.g., chemical mechanical planarization (CMP), to remove the dielectric from the surface while leaving the layer formed within the cavity.

Alternatively, gate dielectric 144 may be formed by a thermal oxidation, nitridation or oxynitridation process. Combinations of the aforementioned processes may also be used in forming the gate dielectric. The gate dielectric may be composed of any conventional dielectric including, but not limited to: $SiO_2$; $Si_3N_4$; SiON; temperature sensitive high-k dielectrics such as $TiO_2$, $Al_2O_3$, $ZrO_2$, $HfO_2$, $Ta_2O_5$, $La_2O_3$; and other like oxides including perovskite-type oxides. Gate dielectric 144 may also comprise any combination of the aforementioned dielectric materials. Note that when temperature sensitive high-k dielectric materials are employed, the second embodiment of the present invention (to be described in more detail hereinbelow) is preferably employed.

After gate dielectric 144 has been formed, gate conductor 142 is formed atop gate dielectric 144 by a conventional deposition process (such as CVD, plasma-assisted CVD, plating, sputtering and etc.) followed by planarization. Gate conductor 142 may comprise any conductive material including but not limited to: polysilicon; a conductive elemental metal such as W, Cu, Pt, Ag, Au, Ru, Ir, Rh, and Re; alloys that include at least one of the aforementioned conductive elemental metals; silicides or nitrides that include at least one of the above-mentioned conductive elemental metals; and combinations thereof may be employed. When a combination of conductive elements is employed, an optional diffusion barrier material such as TaN or WN may be formed between the conductive materials. The resultant structure that is formed after gate dielectric 144 and gate conductor 142 have been formed is shown, for example, in FIG. 20. Note that gate dielectric 144 and gate conductor 142 define the gate region of the semiconductor device 100.

A highly preferred conductive material employed as gate conductor 142 is polysilicon since polysilicon gate conductor's lead to a fully-depleted MOSFET structure with a very low off-current. When a polysilicon gate conductor is employed, the polysilicon gate conductor is formed by deposition, planarization, ion implantation and annealing. The annealing conditions used at this point of the present invention in forming the polySi gate conductor may vary. Exemplary annealing conditions that may be employed in the present invention include: 1050° C. for 5 seconds. Additionally, the replacement metal gate can be comprised of work-function metal (WFM) layers. The work function layer can be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides).

Additionally, contacts 134 are formed to contact the source/drain regions 124. To do so, contact openings are opened using a patterning and etch process. For example, a pattern is produced by applying a photoresist to the surface of the device 100. Radiation is used to expose the photoresist according to a pattern, and then developing the pattern into the photoresist utilizing a resist developer. Once the patterning of the photoresist is completed, the sections covered by the photoresist are protected while the exposed regions are removed using a selective etching process that removes the unprotected regions.

In one embodiment, a hard mask may be used to form the contact openings. The hard mask, such as SiN or $SiO_2$, is deposited atop the ILD 132 and then the photoresist pattern is applied to the hard mask material using a lithography process steps. The photoresist pattern is then transferred into the hard mask material using a dry etch process. Next the photoresist pattern is removed and the hard mask pattern is then transferred into the ILD 132 material down to the source/drain regions 124 during a selective etching process.

Once the contact openings are opened, the openings are filled with a conductive material using, e.g., a deposition process, such as, e.g., CVD. The conductive material can be any conductive metal including, but not limited to W, Ni, Ti, Mo, Ta, Cu, Pt, Ag, Au, Ru, Ir, Rh, and Re, and alloys that include at least one of the aforementioned conductive elemental metals. Upon depositing the conductive material, contacts 134 are formed.

Figure 20:
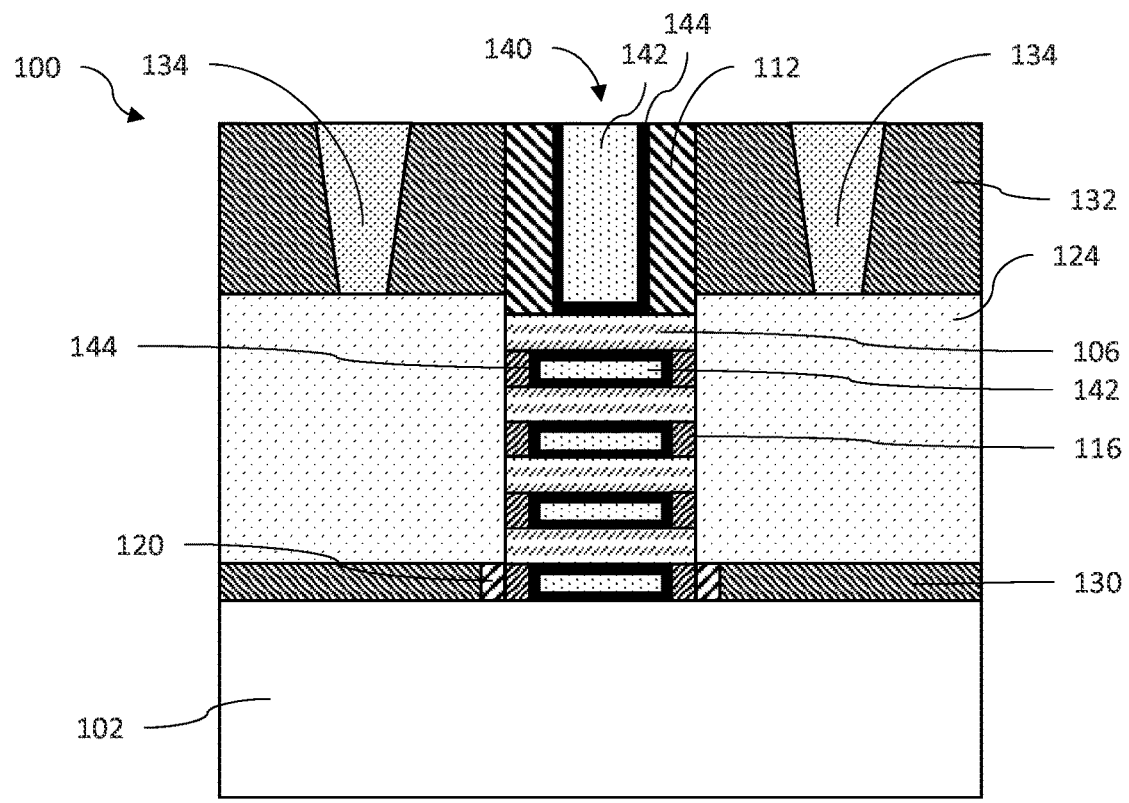
FIG. 20 is a cross-sectional view showing a semiconductor device with an isolation layer between source and drain regions and substrate from the cross-section 20-20 of FIG. 19, in accordance with an embodiment of the present invention.

Referring now to FIG. 20, a cross-sectional view showing a semiconductor device with an isolation layer between source and drain regions and substrate from the cross-section 20-20 of FIG. 19 is illustrated according to an embodiment of the present invention.

As described above, an etch process is used to remove the dummy gate material 114. In the same etch process, or a prior or subsequent etch process, the sacrificial nanosheets 104 can also be recessed and removed. Because the sacrificial nanosheets 104 include a material different from the nanosheets 106 and inner spacers 116, such as, e.g., SiGe, the sacrificial nanosheets 104 can be selectively etched from between those materials. Therefore, the sacrificial nanosheets 104 can be removed by a selective etch process according to the etch selectivity. Accordingly, the sacrificial nanosheets 104 may be removed without a masking step, resulting a hollow stacked gate.

The hollow stacked gate can be filled with the gate dielectric 144 and gate conductor 142 concurrently with the gate dielectric 144 and gate conductor 142 formation described above with reference to FIG. 19. Thus, the spaces between each nanowire 106 is lined with the gate dielectric 144 and filled with the gate conductor 142 to form a stacked nanowire gate structure 142.

Figure 21:
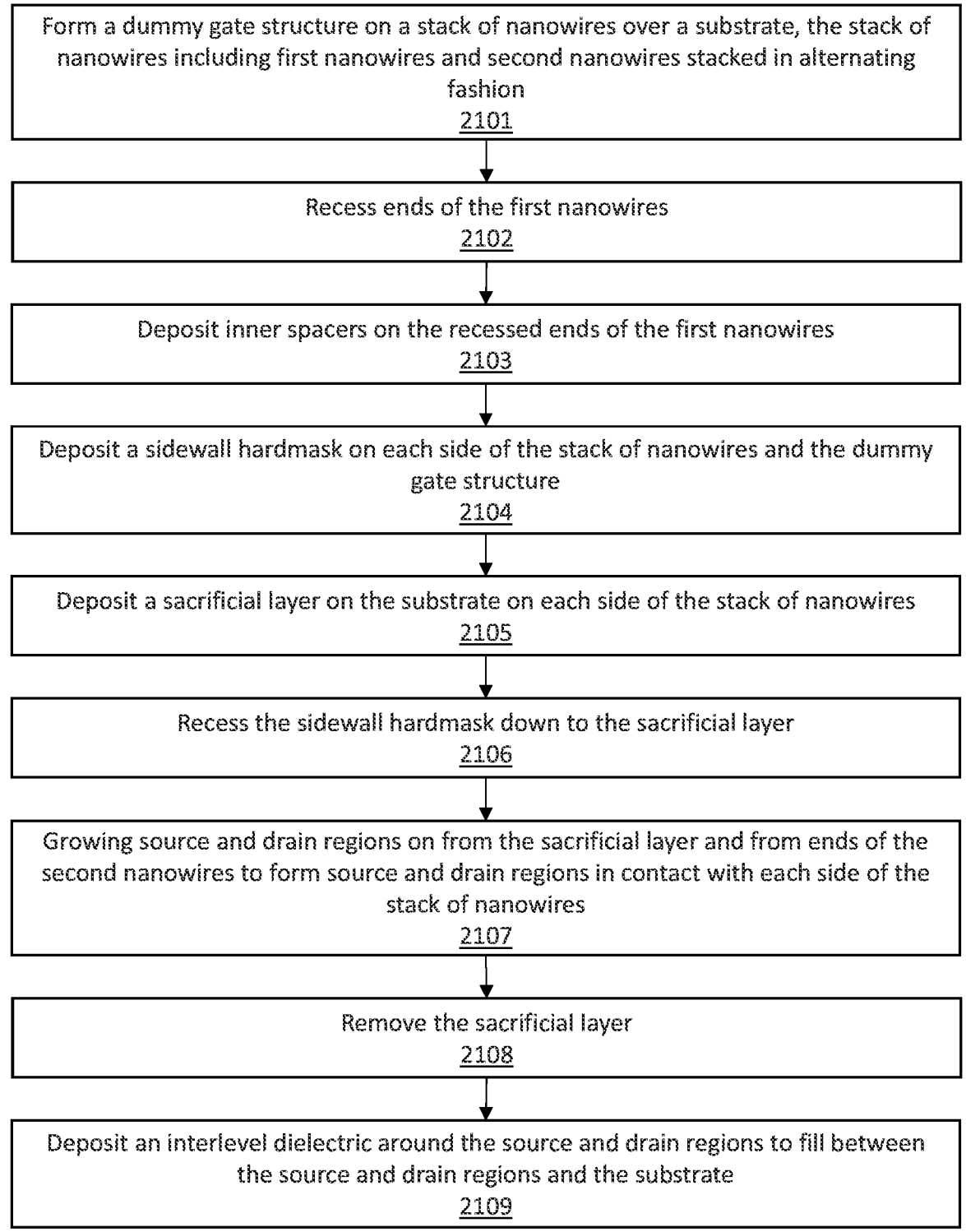
FIG. 21 is a block/flow diagram showing a system/method for forming a semiconductor device with an isolation layer between source and drain regions and substrate, in accordance with an embodiment of the present invention.

Referring now to FIG. 21 is a block/flow diagram showing a system/method for forming a semiconductor device with an isolation layer between source and drain regions and substrate is illustrated according to an embodiment of the present invention.

At block 2101, form a dummy gate structure on a stack of nanosheets over a substrate, the stack of nanosheets including first nanosheets and second nanosheets stacked in alternating fashion.

At block 2102, recess ends of the first nanosheets.

At block 2103, deposit inner spacers on the recessed ends of the first nanosheets.

At block 2104, deposit a sidewall hardmask on each side of the stack of nanosheets and the dummy gate structure.

At block 2105, deposit a sacrificial layer on the substrate on each side of the stack of nanosheets.

At block 2106, recess the sidewall hardmask down to the sacrificial layer.

At block 2107, growing source and drain regions on from the sacrificial layer and from ends of the second nanosheets to form source and drain regions in contact with each side of the stack of nanosheets.

At block 2108, remove the sacrificial layer.

At block 2109, deposit an interlevel dielectric around the source and drain regions to fill between the source and drain regions and the substrate.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a stack of nanosheets on a substrate;
a gate structure including gate spacers on the stack of nanosheets, a gate conductor on the stack of nanosheets between the gate spacers, wherein the gate conductor is between each adjacent pair of nanosheets in the stack of nanosheets and between the substrate and a bottom most nanosheet;
source and drain regions on opposite sides of the stack of nanosheets and in physical contact with opposite ends of the nanosheets;
a layer of isolation material between the source and drain regions and the substrate;
an inner spacer between the layer of isolation material and the gate conductor between the substrate and the bottom-most nanosheet;
a sidewall hardmask on the substrate and between the layer of isolation material and the inner spacer;
an interlevel dielectric burying the source and drain regions;
a first contact in electrical contact with the source region; and
a second contact in electrical contact with the drain region.

2. The semiconductor device of claim 1, wherein the sidewall hardmask is silicon nitride (SiN).

3. The semiconductor device of claim 1, wherein the gate structure further includes a gate dielectric on the sidewalls of the gate spacers, on the substrate, and on the nanosheets in the stack of nanosheets.

4. The semiconductor device of claim 1, wherein the inner spacers are a dielectric material.

5. The semiconductor device of claim 4, wherein the isolation material and the interlevel dielectric are the same material.

6. The semiconductor device of claim 5, wherein the contact are a conductive metal selected from the group consisting of W, Ni, Ti, Mo, Ta, Cu, Pt, Ag, Au, Ru, Ir, Rh, and Re.

7. The semiconductor device of claim 6, wherein the layer of isolation material is a flowable oxide.

8. The semiconductor device of claim 7, wherein the nanosheets are silicon germanium carbide (SiGeC).

9. A semiconductor device, comprising:
a stack of nanosheets on a substrate;
a gate structure including gate spacers on the stack of nanosheets, a gate dielectric on the sidewalls of the gate spacers, on the substrate, and on the nanosheets in the stack of nanosheets, a gate conductor on the gate dielectric between the gate spacers, each adjacent pair of nanosheets in the stack of nanosheets, on the gate dielectric on the substrate;
source and drain regions on opposite sides of the stack of nanosheets and in physical contact with opposite ends of the nanosheets;
a layer of isolation material between the source and drain regions and the substrate;
an inner spacer between the layer of isolation material and the gate conductor between the substrate and the bottom-most nanosheet;
a sidewall hardmask on the substrate and between the layer of isolation material and the inner spacer, wherein the sidewall hardmask is silicon nitride (SiN);
an interlevel dielectric burying the source and drain regions;
a first contact in electrical contact with the source region; and
a second contact in electrical contact with the drain region.

10. The semiconductor device of claim 9, wherein the source and drain regions are in physical contact with outer sidewalls of the gate spacers.

11. The semiconductor device of claim 10, wherein the layer of isolation material is a flowable oxide.

12. The semiconductor device of claim 11, wherein the nanosheets are silicon germanium carbide (SiGeC).

13. The semiconductor device of claim 12, wherein the isolation material and the interlevel dielectric are the same material.

14. The semiconductor device of claim 13, wherein the inner spacers are a dielectric material.

15. A semiconductor device, comprising:
a substrate with a stack of two or more nanosheets disposed thereon;
a gate structure including a gate conductor material and gate spacers, wherein a layer of the gate conductor material and two inner spacers are between a bottom most nanosheet of the stack of nanosheets and the substrate;
source and drain regions disposed on opposing sides of the stack of nanosheets in contact with ends of the nanosheets;
a layer of isolation material between the source and drain regions and the substrate;
a sidewall hardmask separating the layer of isolation material from each of the two inner spacers; and
contacts in electrical contact with the source.

16. The device as recited in claim 15, wherein the isolation material is a flowable oxide and the sidewall hardmask is silicon nitride (SiN).

17. The device as recited in claim 16, wherein the source and drain regions are in physical contact with outer sidewalls of the gate spacers.

* * * * *